(12) United States Patent
Tomita et al.

(10) Patent No.: US 8,269,272 B2
(45) Date of Patent: Sep. 18, 2012

(54) SEMICONDUCTOR DEVICE AND METHOD FOR MANUFACTURING THE SAME

(75) Inventors: Kouta Tomita, Hyogo-ken (JP); Noboru Matsuda, Hyogo-ken (JP); Hideyuki Ura, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 12/886,449

(22) Filed: Sep. 20, 2010

(65) Prior Publication Data

US 2011/0140197 A1 Jun. 16, 2011

(30) Foreign Application Priority Data

Dec. 14, 2009 (JP) ................................. 2009-282526

(51) Int. Cl.
*H01L 29/76* (2006.01)
*H01L 31/062* (2012.01)
(52) U.S. Cl. ......... 257/330; 257/329; 257/341; 438/270
(58) Field of Classification Search .......... 257/329–330, 257/341, E29.262, E21.41; 438/270
See application file for complete search history.

(56) References Cited

U.S. PATENT DOCUMENTS

| 5,430,316 | A | * | 7/1995 | Contiero et al. | 257/335 |
| 6,825,510 | B2 | | 11/2004 | Probst | |
| 6,921,699 | B2 | | 7/2005 | Ma et al. | |
| 7,301,203 | B2 | * | 11/2007 | Lee et al. | 257/339 |

FOREIGN PATENT DOCUMENTS

JP 2009-505434 2/2009

* cited by examiner

*Primary Examiner* — Theresa T Doan
(74) *Attorney, Agent, or Firm* — Patterson & Sheridan, LLP

(57) ABSTRACT

According to one embodiment, a semiconductor device includes a first semiconductor layer of a first conductivity type, a second semiconductor layer, a third semiconductor layer, a fourth semiconductor layer, first trenches, a second trench, an insulating film, a gate electrode, a first main electrode, a second main electrode, a channel stopper layer and a channel stopper electrode. The second semiconductor layer of the first conductivity type is provided on the first semiconductor layer. The third semiconductor layer of a second conductivity type is provided on the second semiconductor layer. The fourth semiconductor layer of the first conductivity type is provided on the third semiconductor layer. The gate electrode is provided in the first trenches via the insulating film. The first main electrode is provided on the first semiconductor layer. The second main electrode is provided to contact the element part. The channel stopper electrode is provided on the termination part.

10 Claims, 8 Drawing Sheets

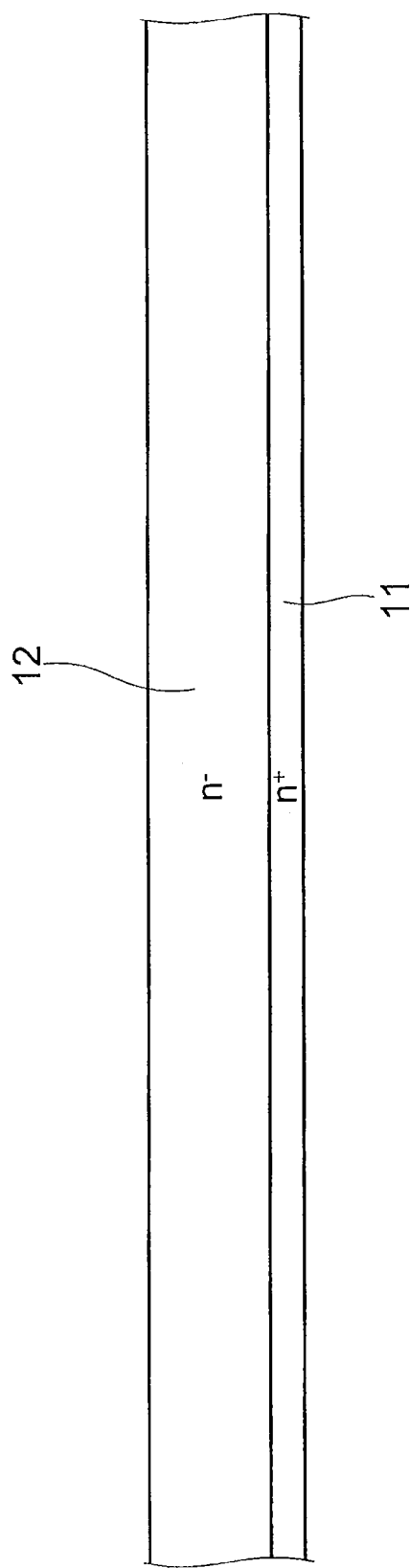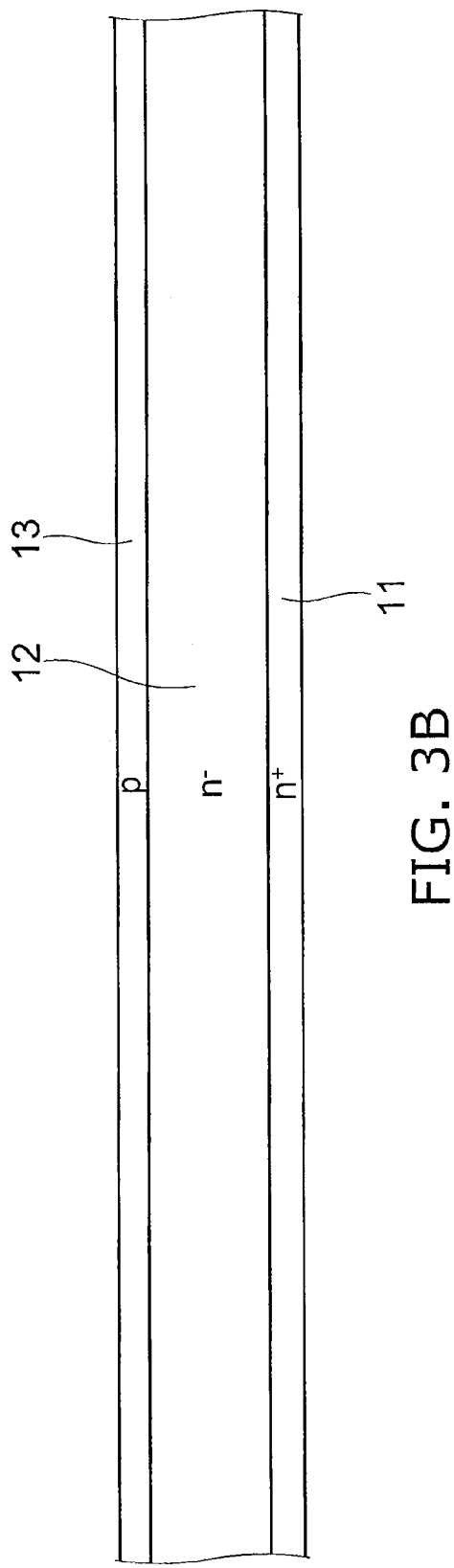

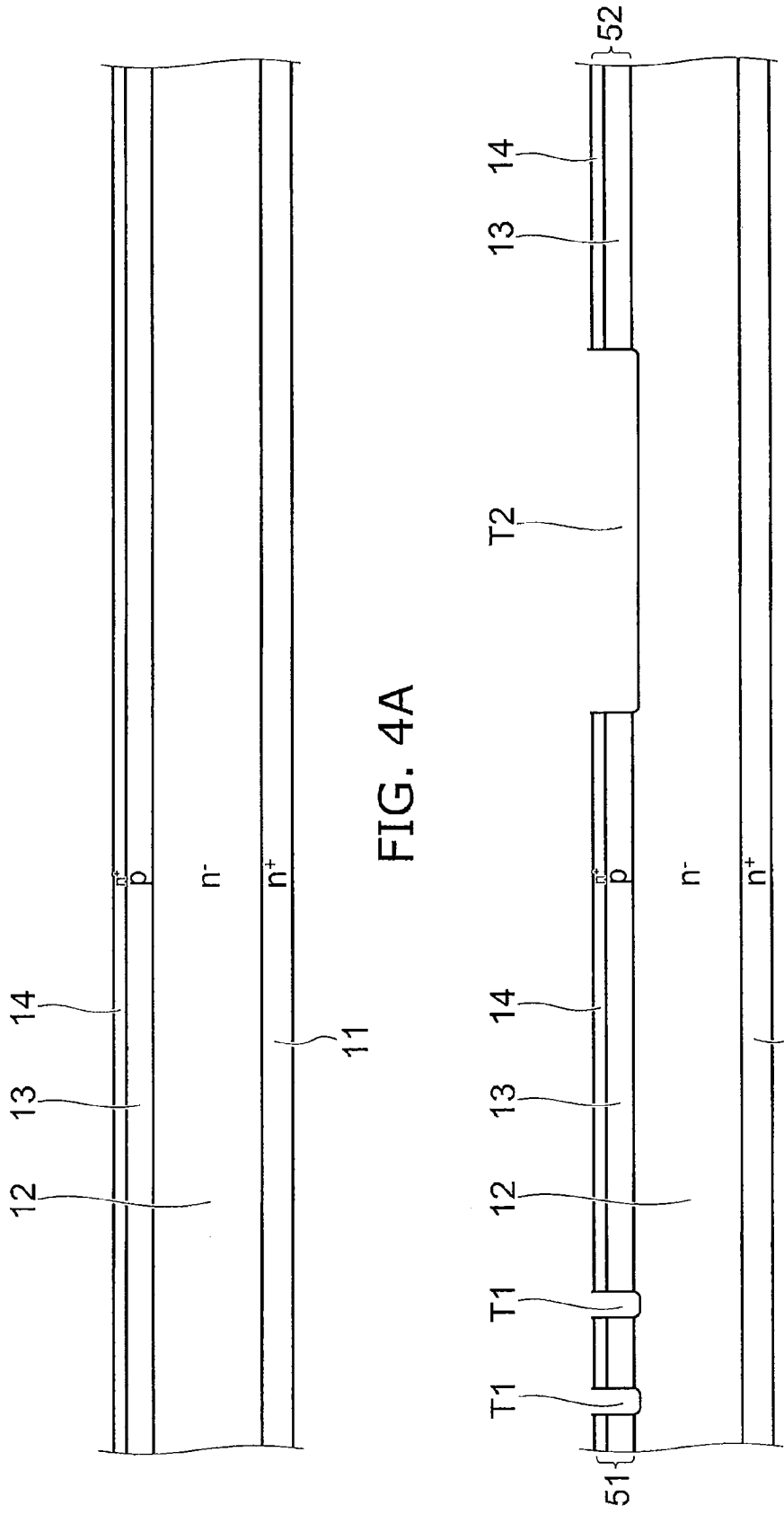

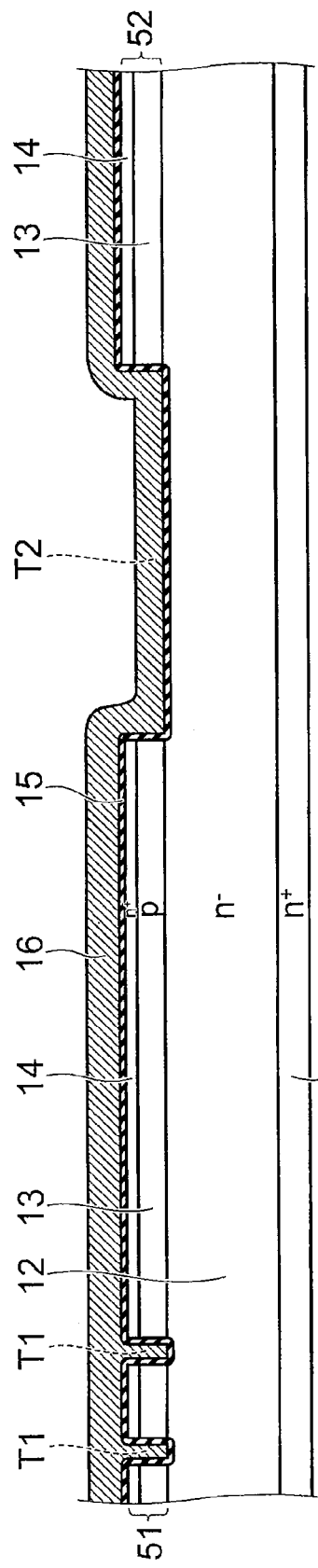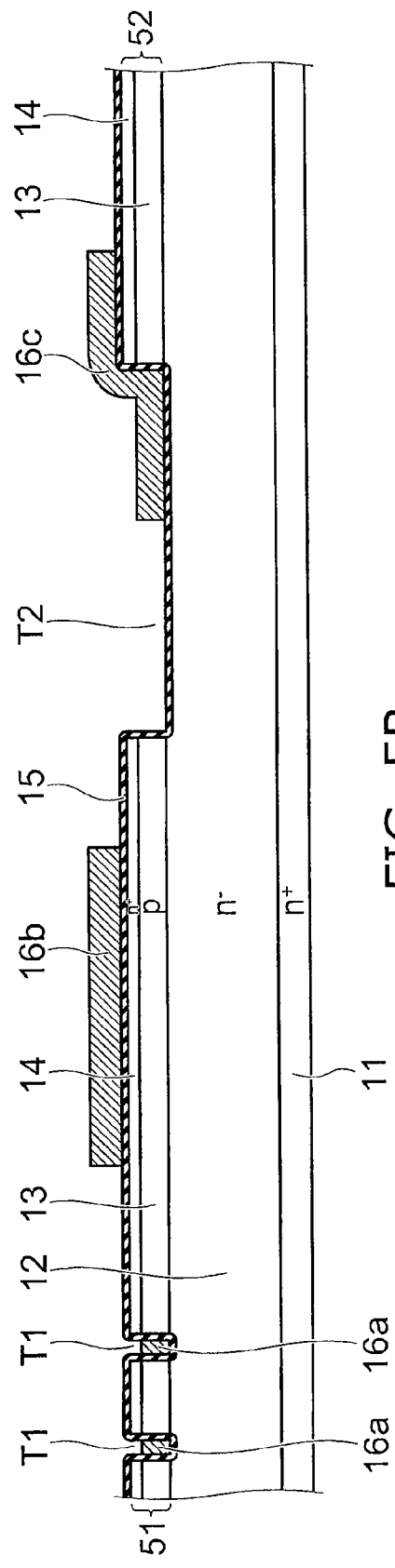

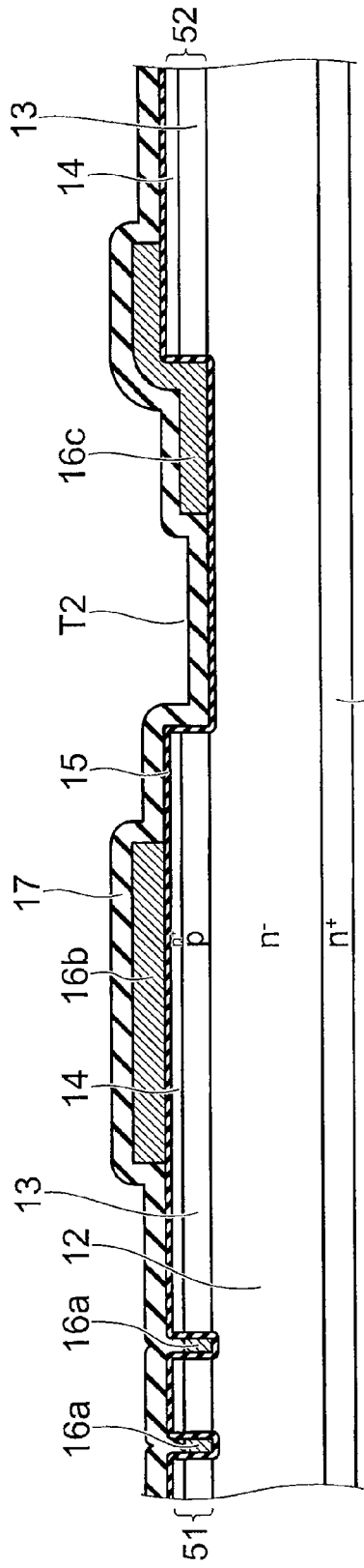
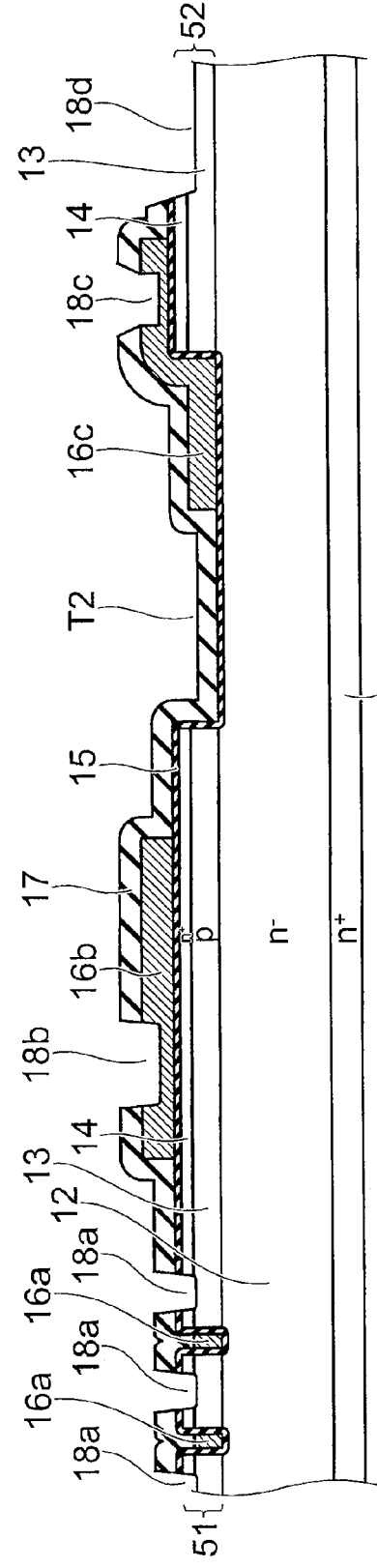

SEMICONDUCTOR DEVICE AND METHOD FOR MANUFACTURING THE SAME

CROSS-REFERENCE TO RELATED APPLICATION

This application is based upon and claims the benefit of priority from Japanese Patent Application No. 2009-282526, filed on Dec. 14, 2009; the entire contents of which are incorporated herein by reference.

FIELD

Embodiments described herein relate generally to a semiconductor device and a method for manufacturing the same.

BACKGROUND

In power semiconductor devices, bases and sources must be terminated. For example, JP-A 2009-505434 discloses an implantation of a source dopant using a mask to selectively form a source region in an element region. To determine the source region, it is necessary to fabricate a mask by lithography and etching. The source region is not formed in the termination region. Hence, the element region structure and the termination region structure cannot be formed in the same process, leading to a problem of an increase in number of processes and thus cost.

BRIEF DESCRIPTION OF THE DRAWINGS

FIGS. 3A to 6B are schematic cross-sectional views illustrating a method for manufacturing the semiconductor device;

DETAILED DESCRIPTION

Figure 1:
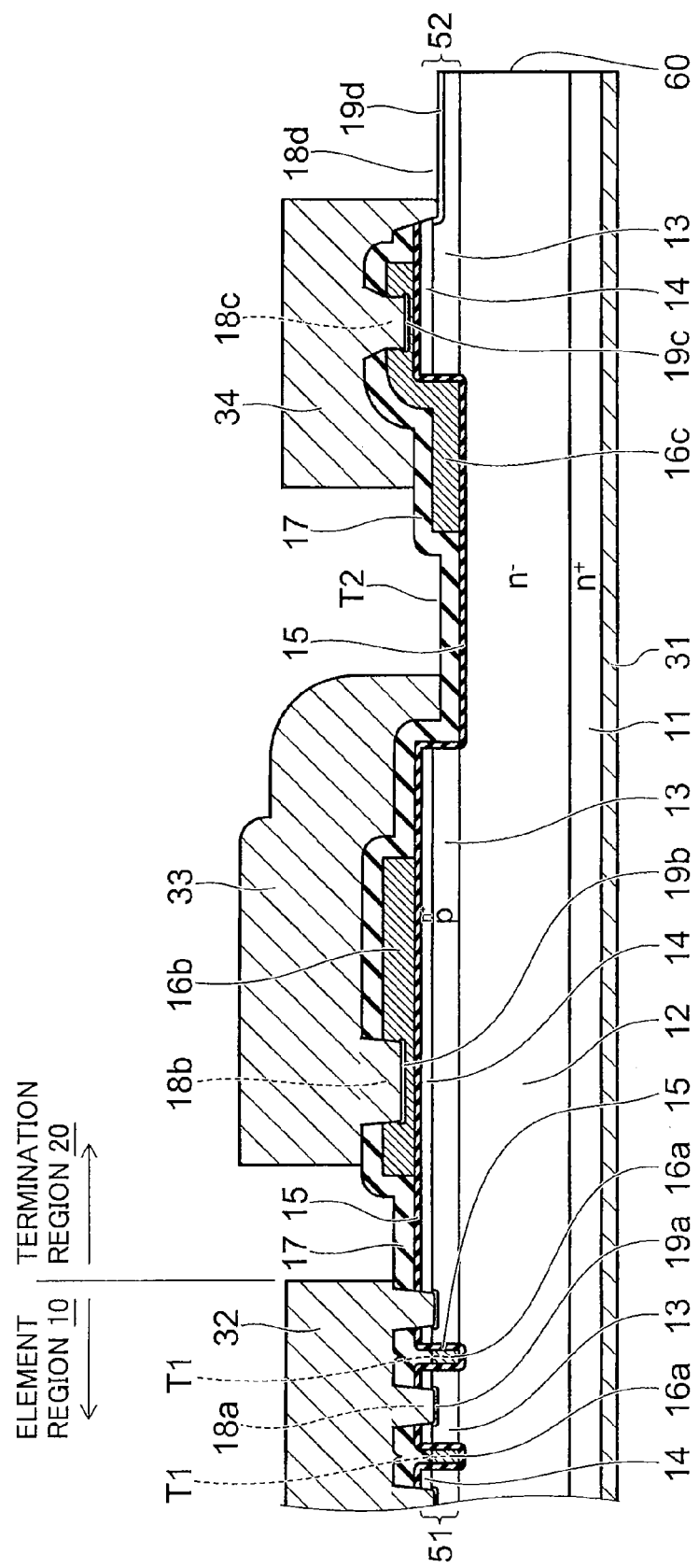
FIG. 1 is a schematic cross-sectional view of a semiconductor device according to an embodiment.

According to one embodiment, a semiconductor device includes a first semiconductor layer of a first conductivity type, a second semiconductor layer, a third semiconductor layer, a fourth semiconductor layer, first trenches, a second trench, an insulating film, a gate electrode, a first main electrode, a second main electrode, a channel stopper layer, and a channel stopper electrode. The second semiconductor layer of the first conductivity type is provided on the first semiconductor layer and has a concentration of first conductivity type impurity lower than a concentration of first conductivity type impurity of the first semiconductor layer. The third semiconductor layer of a second conductivity type is provided on the second semiconductor layer. The fourth semiconductor layer of the first conductivity type is provided on the third semiconductor layer and has a concentration of first conductivity type impurity higher than the concentration of the first conductivity type impurity of the second semiconductor layer. The first trenches penetrate the fourth semiconductor layer and the third semiconductor layer to reach the second semiconductor layer. The second trench penetrates the fourth semiconductor layer and the third semiconductor layer, on a side closer to a termination than the first trenches, to reach the second semiconductor layer, and the second trench divides the fourth semiconductor layer and the third semiconductor layer into a element part including a region wherein the first trenches are formed and a termination part. The insulating film is provided on internal walls of the first trenches and the second trench. The gate electrode is provided in the first trenches via the insulating film. The first main electrode is provided on the first semiconductor layer, on a surface opposite to a surface where the second semiconductor layer is provided. The second main electrode is provided to contact the element part of the third semiconductor layer and the element part of the fourth semiconductor layer. The channel stopper layer is provided in the second trench via the insulating film. The channel stopper electrode is provided on the termination part of the third semiconductor layer and the termination part of the fourth semiconductor layer and connects the channel stopper layer and the termination part.

Embodiments are described below in detail while referring to the attached drawings. In the following embodiment, a first conductivity type is described as being an n-type conductivity and a second conductivity type as being a p-type conductivity. However, the embodiments can also be applied when the first conductivity type is a p-type conductivity and the second conductivity type is an n-type conductivity. Also, although the semiconductor is exemplified as being silicon, a semiconductor made of a material other than silicon (i.e., compound semiconductors such as SiC, GaN) may be used. Moreover, a silicon oxide film, a silicon nitride film, a silicon oxynitride film, or the like can be used as an insulating film.

Figure 2A:
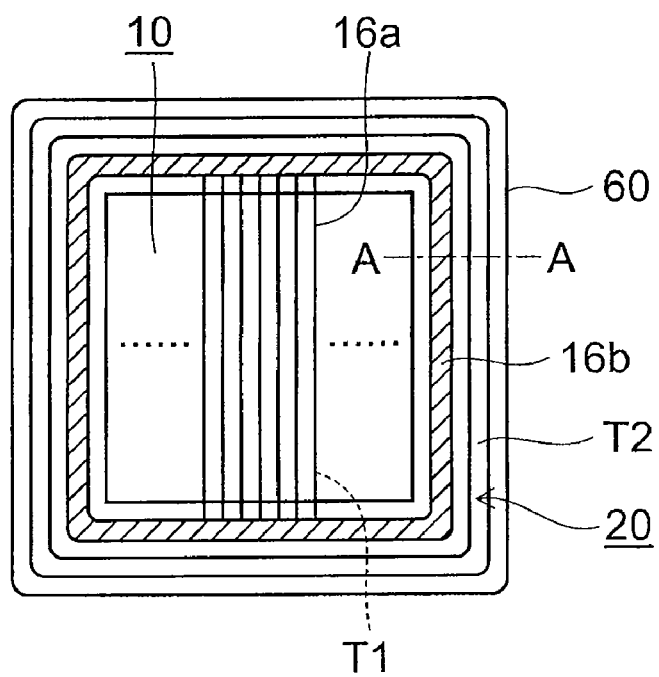
FIGS. 2A and 2B are schematic views illustrating a planar layout of a relevant part of the semiconductor device.

FIG. 1 is a schematic cross-sectional view of a semiconductor device according to an embodiment. FIG. 2A is a schematic view of a planar layout of the relevant part in the semiconductor device. FIG. 1 corresponds to a cross-section taken along line A-A in FIG. 2A.

The semiconductor device according to this embodiment is a vertical type device having a first main electrode provided on one main surface side of a semiconductor layer and a second main electrode provided on another main surface side. When a gate is on, current flows in a vertical direction between the first main electrode and the second main electrode.

The semiconductor device according to this embodiment includes an element region 10 and a termination region 20. In the element region 10, a metal-oxide-semiconductor field effect transistor (MOSFET) or a metal-insulator-semiconductor field effect transistor (MISFET) using a trench gate structure is formed. The termination region 20 surrounds the element region 10.

The semiconductor layer includes an $n^+$-type drain layer or substrate (first semiconductor layer) 11, an $n^-$-type drift layer (second semiconductor layer) 12, a p-type base layer (third semiconductor layer) 13, and an $n^+$-type source layer (fourth semiconductor layer) 14. In the drift layer 12, a concentration of n-type impurity is lower than in the drain layer 11 or in the source layer 14.

The drift layer 12 is provided on the drain layer 11, the base layer 13 is provided on the drift layer 12, and the source layer 14 is provided on the base layer 13.

First trenches T1 are formed in the element region 10. The first trenches T1 penetrate the source layer 14 and the base layer 13 in the element region 10, reaching the drift layer 12. An insulating film 15 that functions as a gate insulating film is formed on sidewalls and bottoms of the first trenches T1. Gate electrodes 16a are embedded within the first trenches T1 via the insulating film 15.

In the element region 10, a plurality of the first trenches T1 and the gate electrodes 16a are formed, and as illustrated in FIG. 2 may, for example, be formed in a striped planar pattern. The first trenches T1 and the gate electrodes 16a are not limited to being formed in a striped planar pattern, and may be laid out in a lattice pattern or as a plurality of islands.

In the termination region 20, a second trench T2 is formed. The second trench T2 penetrates the source layer 14 and the base layer 13 in the termination region 20, reaching the drift layer 12. The first trenches T1 and the second trench T2 are of substantially the same depth. The second trench T2 is wider than each of the first trenches T1.

The second trench T2 surrounds the element region 10 in a continuous manner, as illustrated in FIG. 2. The second trench T2 divides the source layer 14 and the base layer 13 into an element part 51 that includes the element region 10 where the first trenches T1 are formed, and a termination part 52 on a termination side of the second trench T2.

The insulating film 15 is formed on sidewalls and a bottom of the second trench T2. The insulating film 15 is also formed on a surface of the source layer 14 between the first trenches T1 and the second trench T2, and on a surface of the source layer 14 on a termination side of the second trench T2. The insulating film 15 formed in the first trenches T1, the insulating film 15 formed in the second trench T2 and the insulating film 15 formed on the surface of the source layer 14 are, as described hereinafter, formed integrally and simultaneously in the same process using the same material.

In an outer peripheral part on the termination side in the second trench T2, a channel stopper layer 16c is provided on the insulating film 15. The channel stopper layer 16c is formed so as to rise up from the second trench T2 onto the source layer 14 of the termination part 52, and thus cover the step between the second trench T2 and the termination part 52. In other words, the channel stopper layer 16c is provided on the outer peripheral part of the second trench T2 and on the termination part 52 via the insulating film 15.

In the termination region 20, gate interconnection 16b is provided on the source layer 14 between the first trenches T1 and the second trench T2 via the insulating film 15. The gate interconnection 16b, as illustrated in FIG. 2, surrounds the element region 10 on an inner side of the second trench T2.

Both ends of the gate electrodes 16a, extending in a stripe-like manner, extend beyond the first trenches T1 and connect to the gate interconnection 16b. As a result, each of the gate electrodes 16a is electrically connected to the gate interconnection 16b.

The gate electrodes 16a, the gate interconnection 16b, and the channel stopper layer 16c are, as described hereinafter, formed simultaneously in the same process, and made of the same material (i.e., polycrystalline silicon).

An interlayer insulating film 17 is formed on the gate electrodes 16a, the insulating film 15, and the gate interconnection 16b. The interlayer insulating film 17 blocks openings of the first trenches T1. Additionally, the interlayer insulating film 17 covers the gate interconnection 16b. Furthermore, the interlayer insulating film 17 is also formed in the second trench T2 on an inner peripheral part of the element region 10 side and on the channel stopper layer 16c. The interlayer insulating film 17 covers a step on the inner peripheral side of the second trench T2.

A drain electrode 31 is provided as a first main electrode that extends over an entire area of a surface opposite the surface where the drift layer 12 is provided in the drain layer 11. The drain layer 11 is electrically connected to the drain electrode 31.

A source electrode 32 is provided as a second main electrode on the interlayer insulating film 17 in the element region 10. The element region 10 has formed therein a contact opening 18a that penetrates the interlayer insulating film 17, the insulating film 15 and the source layer 14 to reach a surface of the base layer 13, and the source electrode 32 is provided in the contact opening 18a. The source electrode 32 in the contact opening 18a is in ohmic contact with side surfaces of the source layer 14 and the surface of the base layer 13. A p$^+$-type base contact layer 19a, which has a higher concentration of p-type impurity than the base layer 13 is formed at a contact region between the source electrode 32 and the base layer 13. The source layer 14 and the base layer 13 are electrically connected to the source electrode 32. A contact structure of the source electrode 32 is formed on a side of the element region 10 furthest toward the termination region 20.

A field plate electrode 33 is provided on the interlayer insulating film 17 from a position over the gate interconnection 16b to the inner peripheral part of the second trench T2. A contact opening 18b that penetrates the interlayer insulating film 17 to reach the gate interconnection 16b is formed in the interlayer insulating film 17 on the gate interconnection 16b, and the field plate electrode 33 is provided in the contact opening 18b. The field plate electrode 33 in the contact opening 18b is in ohmic contact with the gate interconnection 16b. A p$^+$-type gate interconnection contact layer 19b, which has a higher concentration of p-type impurity than the base layer 13, is formed at a contact region between the field plate electrode 33 and the gate interconnection 16b. The gate interconnection 16b is electrically connected to the field plate electrode 33.

A channel stopper electrode 34 is provided on the interlayer insulating film 17 on the channel stopper layer 16c. A contact opening 18c that penetrates the interlayer insulating film 17 to reach the channel stopper layer 16c is formed in the interlayer insulating film 17 on the channel stopper layer 16c, and the channel stopper electrode 34 is provided in the contact opening 18c. The channel stopper electrode 34 in the contact opening 18c is in ohmic contact with the channel stopper layer 16c. A p$^+$-type channel stopper contact layer 19c, which has a higher concentration of p-type impurity than the base layer 13, is formed at a contact region between the channel stopper electrode 34 and the channel stopper layer 16c. The channel stopper layer 16c is electrically connected to the channel stopper electrode 34.

The source layer 14 is not provided on a surface of the base layer 13 of the termination part 52 on a termination side of the channel stopper layer 16c. On this surface, a p$^+$-type a termination contact layer 19d, which has a higher concentration of p-type impurity than the base layer 13, is provided. The channel stopper electrode 34 is also provided on the termination contact layer 19d, and is in ohmic contact with the termination contact layer 19d. Hence, the channel stopper layer 16c is electrically connected to the surface of the termination part 52 via the channel stopper electrode 34. The channel stopper layer 16c and the channel stopper electrode 34 are formed into ring shapes so as to surround the element part 51 of the base layer 13 and the source layer 14.

The drain electrode 31, the source electrode 32, the field plate electrode 33, and the channel stopper electrode 34 are formed from a metal material. Additionally, as described hereinafter, the source electrode 32, the field plate electrode 33, and the channel stopper electrode 34 are formed simultaneously using the same process and are made from the same material.

In the semiconductor device according to the above-described embodiment, when a desired electric potential is applied to the gate electrode 16a via the gate interconnection 16b, an n-channel (inverted layer) is formed in a region facing the gate electrode 16a in the base layer 13 of the element region 10. Accordingly, an electric current flows between the drain electrode 31 and the source electrode 32 via the drain layer 11, the drift layer 12, the n-channel and the source layer 14, and the element turns on.

Additionally, with the drain electrode 31 held at a high potential with respect to the source electrode 32, a depletion layer extends from a PN junction between the base layer 13 and the drift layer 12. The depletion layer extends vertically in the drift layer 12 of the termination region 20 and horizontally towards the termination, and thus a high withstanding voltage can be obtained.

The field plate electrode 33 is provided in the termination region 20 so as to cover the step between the element part 51 of the source layer 14 and the base layer 13 and the inner peripheral part of the second trench T2. The potential of the field plate electrode 33 is substantially equivalent to the gate potential. Accordingly, it is possible to suppress electric field concentration in the termination region 20, and in particular in edge parts and corner parts of the element part 51 of the source layer 14 and the base layer 13. Note that the same effect can be obtained by connecting the field plate electrode 33 to the source electrode 32 and not to the gate interconnection 16b.

There is a tendency for a termination surface 60, which forms a cut surface during cutting from a wafer, to be crushed by the cutting, thus leading to a drop in electrical resistance. The surface of the termination part 52 is consequently electrically connected to the drain layer 11 and the drain electrode 31 via the termination surface 60, and the surface of the termination part 52 reaches a potential that is substantially equivalent to the drain potential. The channel stopper electrode 34 connected to the surface of the termination part 52 and the channel stopper layer 16c connected to the channel stopper electrode 34 also reach a potential that is substantially equivalent to the drain potential. The extension of the depletion layer is thereby halted, and the depletion layer does not reach the termination surface 60. As a result, current leakage from a crushed part of the termination surface 60 can be prevented.

The surface of the termination part 52 is a contact layer 19d, which has a comparatively high concentration of impurity, and the surface of the contact layer 19d is in contact with the channel stopper electrode 34. Hence, the electrical connection between the channel stopper electrode 34 and the drain electrode 31 is reliably secured via the low-resistance contact layer 19d.

Figure 2B:
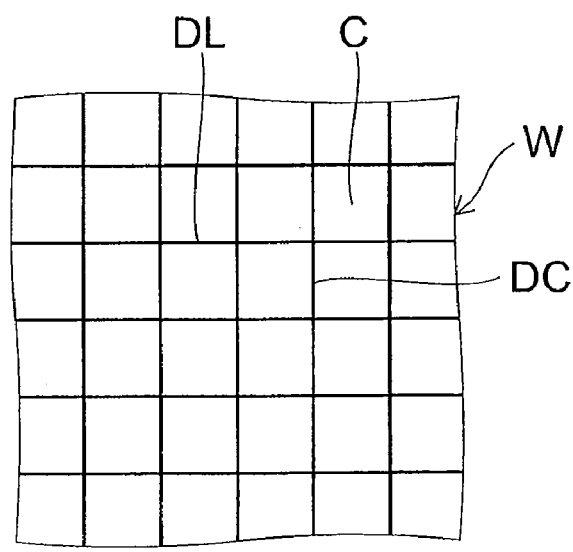

In the semiconductor device according to this embodiment, after the various elements have been formed in a wafer state, the wafer W is cut along, for example, lattice-like dicing lines DL to form a plurality of individual chips C, as illustrated in FIG. 2B. The cut surface in this process is the termination surface 60 in the individual devices shown in FIG. 1 and FIG. 2A.

A structure of the termination region 20 in the semiconductor device according to this embodiment can, as described hereinafter, be formed simultaneously with the forming of the structure of the element region 10 in the same process.

Next, a method for manufacturing the semiconductor device according to this embodiment will be described with reference to FIG. 3 to FIG. 6.

First, as illustrated in FIG. 3A, the n⁻-type drift layer 12 is formed on an entire surface of the n⁺-type drain layer 11 (the substrate). Next, as illustrated in FIG. 3B, the p-type base layer 13 is formed on an entire surface of the drift layer 12.

Next, as illustrated in FIG. 4A, the n⁺-type source layer 14 is formed over an entire surface of the base layer 13.

In this embodiment, the base layer 13 and the source layer 14 are formed not just in the element region, but over all regions of the drift layer 12, including the termination region. The base layer 13 can, for example, be formed by implanting impurity across all regions of the drift layer 12 and subsequently annealing to disperse the implanted impurity. Alternatively, the base layer 13 may be formed on the drain layer 12 by epitaxial growth. The source layer 14 can be formed in the same way by using either an ion implantation method or an epitaxial growth method.

Next, as illustrated in FIG. 4B, the first trenches T1 that penetrate the source layer 14 and the base layer 13 to reach the drift layer 12 and the second trench T2 that also penetrates the source layer 14 and the base layer 13 to reach the drift layer 12 are formed. The first trenches T1 and the second trench T2 are, for example, formed simultaneously using a reactive ion etching (RIE) method with a mask (not shown) having openings selectively formed therein. The stacked body of the base layer 13 and the source layer 14 is divided into the element part 51 and the termination part 52 by the second trench T2.

Next, as shown in FIG. 5A, the insulating film 15 is formed on the internal walls of the first trenches T1, on the internal walls of the second trench T2 and on the surface of the source layer 14. Thereafter, a conductive material 16 is formed on the insulating film 15. The conductive material 16 is, for example, polycrystalline silicon. The conductive material 16 is also embedded in the first trenches T1 and the second trench T2.

Next, a mask (not shown) is formed on the conductive material 16, and etchbacking is performed on the conductive material 16. A portion of the conductive material 16 is thereby selectively left behind, as shown in FIG. 5B. The conductive material that will become the gate electrodes 16a is left behind in the first trenches T1. The conductive material that will become the channel stopper layer 16c is left behind on the outer peripheral part of the second trench T2 and a portion of termination part 52. The conductive material that will become the gate interconnection 16b is left behind on the insulating film 15 between the first trenches T1 and the second trench T2.

Next, as illustrated in FIG. 6A, the interlayer insulating film 17 is formed on the insulating film 15. The interlayer insulating film 17 covers the gate electrodes 16a, the gate interconnection 16b, and the channel stopper layer 16c.

Next, as illustrated in FIG. 6B, openings 18a to 18d are formed that penetrate the interlayer insulating film 17 to reach the layers below. The openings 18a to 18d are formed simultaneously using an RIE method that employs a mask (not shown).

The opening 18a penetrates the interlayer insulating film 17, the insulating film 15, and the source layer 14 of the element part 51 to reach the base layer 13 of the element part 51. On side surfaces of the opening 18a, the source layer 14 is exposed. At a bottom of the opening 18a, the base layer 13 is exposed.

The opening 18b penetrates the interlayer insulating film 17 to reach the gate interconnection 16b. At a bottom of the opening 18b, the gate interconnection 16b is exposed.

The opening 18c penetrates the interlayer insulating film 17 to reach the channel stopper layer 16c. At a bottom of the opening 18c, the channel stopper layer 16c is exposed.

The opening 18d penetrates the interlayer insulating film 17, the insulating film 15 and the source layer 14 on the termination part 52 to reach the base layer 13 of the termination part 52. At a bottom of the opening 18*d*, the base layer 13 of the termination part 52 is exposed.

Next, p-type impurity is simultaneously implanted into the exposed surfaces at the bottoms of the openings 18*a* to 18*d*, and annealing is subsequently performed. Accordingly, as illustrated in FIG. 1, the base contact layer 19*a*, the gate interconnection contact layer 19*b*, the channel stopper contact layer 19*c*, and the termination contact layer 19*d*, all being p$^+$-type layers, are formed on the bottom of the openings 18*a* to 18*d*.

Next, an electrode material is formed on an entire surface of the interlayer insulating film 17 using, for example, a deposition method. Selective etching is subsequently performed using a mask (not shown). In this way, as illustrated in FIG. 1, the source electrode 32, the field plate electrode 33, and the channel stopper electrode 34 are formed. Additionally, the drain electrode 31 is formed on an entire back surface of the drain layer 11.

The source electrode 32 fills the opening 18*a*. The source electrode 32 in the opening 18*a* is in contact with the side surface of the source layer 14 of the element part 51. Additionally, the source electrode 32 is electrically connected to the base layer 13 of the element part 51 via the base contact layer 19*a* at the bottom of the opening 18*a*.

The field plate electrode 33 fills the opening 18*b*. At the bottom of the opening 18*b*, the field plate electrode 33 is electrically connected to the gate interconnection 16*b* via the gate interconnection contact layer 19*b*.

The channel stopper electrode 34 fills the opening 18*c*. At the bottom of the opening 18*c*, the channel stopper electrode 34 is electrically connected to the channel stopper layer 16*c* via the channel stopper contact layer 19*c*.

The channel stopper electrode 34 is also formed on the termination contact layer 19*d* more on the termination side than the channel stopper layer 16*c*. The channel stopper electrode 34 is electrically connected to the drain electrode 31 via the termination contact layer 19*d* and the crushed part of the termination surface 60.

In this embodiment, the base layer 13 and the source layer 14 are formed across all regions, including the element region and the termination region. Thereafter, the first trenches T1 for a trench gate type transistor are formed in the element region and the second trench T2 is simultaneously formed in the termination region. The base layer 13 and the source layer 14 of the element region are separated from the termination side portion by the second trench T2, and thereby terminated. In other words, the base layer 13 and the source layer 14 can be terminated without performing a lithography process. A process of forming a mask by photolithography and etching and selectively implanting impurity into the element region to form the base layer 13 and the source layer 14 is not required.

Thus, in this embodiment, it is possible to form the termination structure at the same time as forming the trench gate type transistor in the element region without additional processes. The result of which is a substantial reduction in cost.

Figure 7:
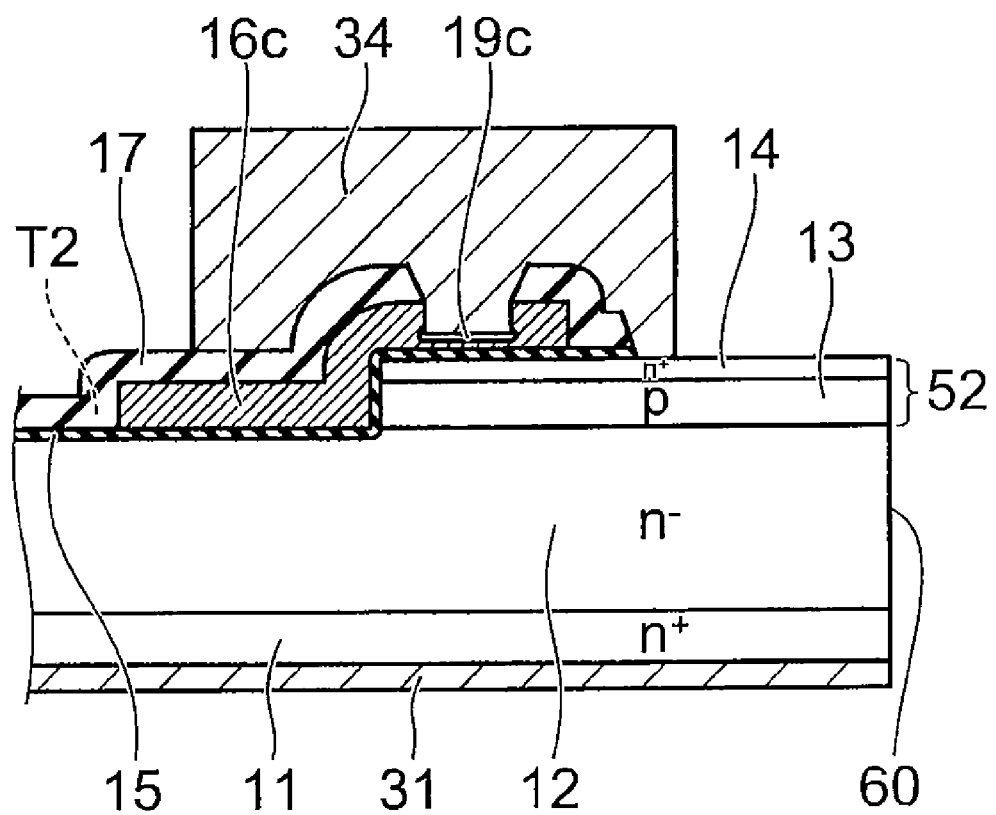
FIG. 7 is a schematic cross-sectional view of a termination part of a semiconductor device according to another embodiment.

As illustrated in FIG. 7, the source layer 14 in the termination part 52 need not be removed, and the channel stopper electrode 34 may be caused to contact the surface of the source layer 14. In this case too, the channel stopper electrode 34 can be reliably set to the drain potential via the source layer 14, where the concentration of impurity is comparatively high (resistance is low), and the crushed part of the termination surface 60.

In the above-described embodiment, when the arrangement is in the state illustrated in FIG. 6A, by not forming a mask on the interlayer insulating film 17 on the side closer to the termination than the channel stopper layer 16*c*, the interlayer insulating film 17, the insulating film 15 and the source layer 14 of the termination part 52 are etched simultaneously with the etching that forms the opening 18*a* of the element region, thereby exposing the surface of the base layer 13 (FIG. 6B). Then, when performing the process in which p-type impurity is implanted into the bottom of the opening 18*a* to form the base contact layer 19*a*, the termination contact layer 19*d* can be simultaneously formed by implantation of p-type impurity into the surface of the base layer 13 of the termination part 52. Thus, the contact layer 19*d* for lowering the resistance of the contact region between the surface of the termination part 52 and the channel stopper electrode 34, and the contact layer 19*a* for connecting the base layer 13 in the element region 10 to the source electrode 32 can be formed simultaneously, resulting in favorable efficiency.

FIG. 1 illustrates an example in which the source electrode 32, the field plate electrode 33, and the channel stopper electrode 34 are connected to the layers using a trench contact structure. However, as illustrated in FIG. 8, a structure in which the electrodes make contact at the surfaces of the layers may also be used.

In the above-described process illustrated in FIG. 6B, the contact layer 19*a* that reaches to the base layer 13 is formed by penetrating the interlayer insulating film 17 and the insulating film 15 with the opening 18*a*, implanting p-type impurity from the surface of the source layer 14 at the bottom of the opening 18*a*, and annealing. Similarly, the contact layer 19*b* is formed by penetrating the interlayer insulating film 17 with the opening 18*b*, implanting p-type impurity in the surface of the gate interconnection 16*b* at the bottom of the opening 18*b*, and annealing. Similarly, the contact layer 19*c* is formed by penetrating the interlayer insulating film 17 with the opening 18*c*, implanting p-type impurity in the surface of the channel stopper layer 16*c* at the bottom of the opening 18*c*, and annealing. Similarly, the contact layer 19*d* that reaches to the base layer 13 of the termination part 52 is formed by penetrating the interlayer insulating film 17 and the insulating film 15 with the opening 18*d*, implanting p-type impurity from the surface of the source layer 14 at the bottom of the opening 18*d*, and annealing. These processes are performed simultaneously.

Figure 8:
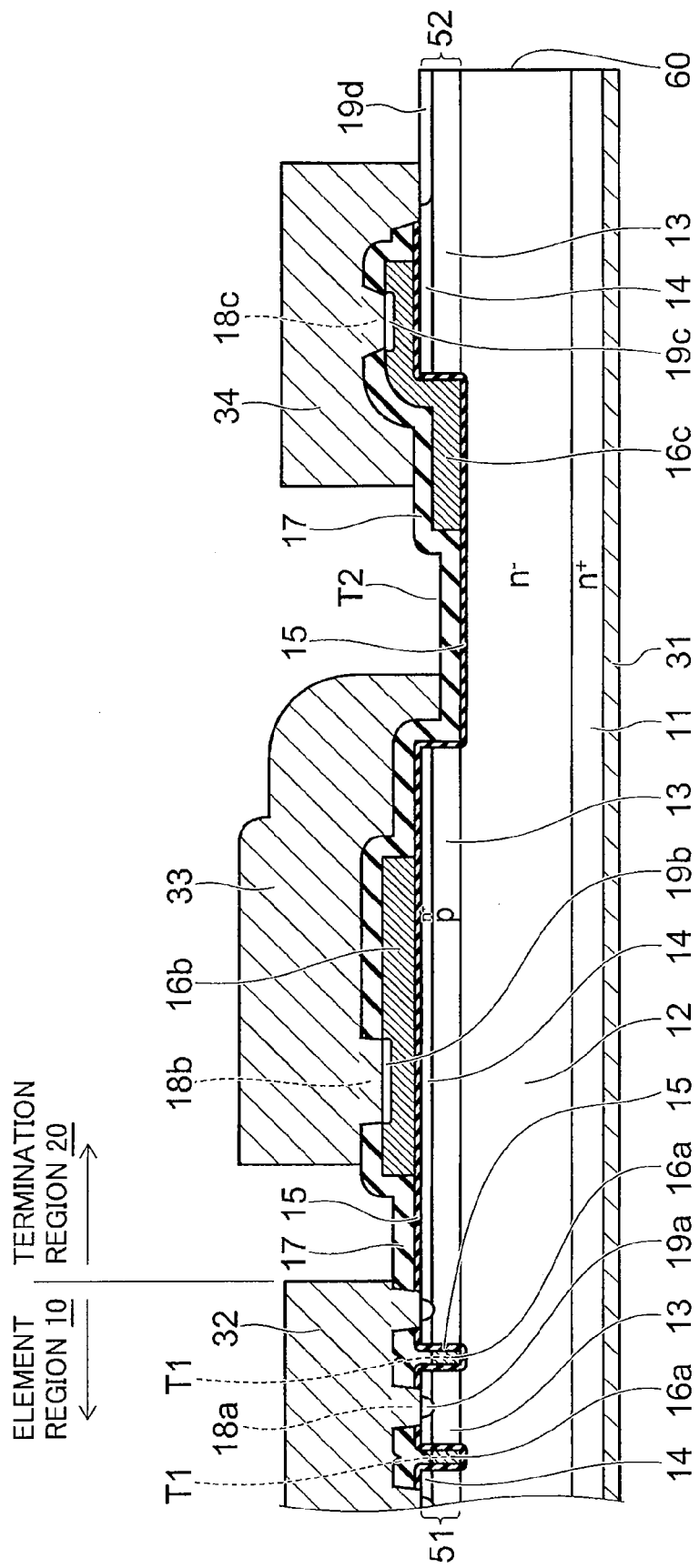
FIG. 8 is a schematic cross-sectional view of a semiconductor device according to still another embodiment.

In the structure of FIG. 8, the source electrode 32 is in contact with the surface of source layer 14, and is electrically connected to the base layer 13 via the contact layer 19*a* that reaches from the surface of the source layer 14 to the base layer 13. The field plate electrode 33 is in contact with the contact layer 19*b* formed on the surface of the gate interconnection 16*b*. The channel stopper electrode 34 is in contact with the contact layer 19*c* formed on the surface of the channel stopper layer 16*c*. The channel stopper layer 16*c* is in contact with the contact layer 19*d* formed on the surface of the termination part 52.

For example, the embodiments are not limited to applications to MOSFETs, but can also be applied to injection enhanced gate transistors (IEGT), insulated gate bipolar transistors (IGBT), and the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A semiconductor device comprising:
a first semiconductor layer of a first conductivity type;
a second semiconductor layer of the first conductivity type, provided on the first semiconductor layer, having a concentration of first conductivity type impurity lower than a concentration of first conductivity type impurity of the first semiconductor layer;
a third semiconductor layer of a second conductivity type provided on the second semiconductor layer;
a fourth semiconductor layer of the first conductivity type, provided on the third semiconductor layer, having a concentration of first conductivity type impurity higher than the concentration of the first conductivity type impurity of the second semiconductor layer;
first trenches which penetrate the fourth semiconductor layer and the third semiconductor layer to reach the second semiconductor layer;
a second trench which penetrates the fourth semiconductor layer and the third semiconductor layer, on a side closer to a termination than the first trenches, to reach the second semiconductor layer, the second trench dividing the fourth semiconductor layer and the third semiconductor layer into a element part including a region wherein the first trenches are formed and a termination part;
an insulating film provided on internal walls of the first trenches and the second trench;
a gate electrode provided in the first trenches via the insulating film;
a first main electrode provided on the first semiconductor layer, on a surface opposite to a surface where the second semiconductor layer is provided;
a second main electrode provided to contact the element part of the third semiconductor layer and the element part of the fourth semiconductor layer;
a channel stopper layer provided in the second trench via the insulating film; and
a channel stopper electrode provided on the termination part of the third semiconductor layer and the termination part of the fourth semiconductor layer and connecting the channel stopper layer and the termination part.

2. The device according to claim 1, wherein the second trench surrounds the element part in a continuous manner.

3. The device according to claim 1, wherein the channel stopper layer surrounds the element part in a continuous manner.

4. The device according to claim 1, further comprising:
a contact layer of the second conductivity type provided at a portion of the third semiconductor layer contacting the second main electrode and at a portion contacting the channel stopper electrode, and having a concentration of second conductivity type impurity higher than a concentration of a second conductivity type impurity of the third semiconductor layer.

5. The device according to claim 1, wherein the insulating film is also provided on the fourth semiconductor layer between the first trench and the second trench.

6. The device according to claim 5, further comprising:
a gate interconnection provided on the insulating film on the fourth semiconductor layer between the first trench and the second trench, and connected to the gate electrode.

7. The device according to claim 6, further comprising:
a field plate electrode provided on the gate interconnection, and connected to the gate interconnection.

8. The device according to claim 7, wherein
the channel stopper layer is provided in an outer peripheral part on the termination side in the second trench,
the field plate electrode is also provided in an inner peripheral part on the element part side in the second trench.

9. The device according to claim 1, further comprising:
a contact layer of the second conductivity type provided on a surface of the termination part, contacting the third semiconductor layer and having a concentration of the second conductivity type impurity higher than a concentration of the second conductivity type impurity of the third semiconductor layer,
the channel stopper electrode being connected to the contact layer.

10. The device according to claim 1, wherein
a potential of the first main electrode is applied to a surface of the termination part via a termination surface forming a cut surface during cutting from a wafer state.

* * * * *